(12) United States Patent
Knap et al.

(10) Patent No.: US 9,726,703 B2
(45) Date of Patent: Aug. 8, 2017

(54) DEVICE FOR MEASURING THE STATE OF POLARIZATION OF AN INCIDENT WAVE OF FREQUENCY 10 GHZ TO 30 THZ

(71) Applicant: CENTRE NATIONAL DE LA RECHERCHE SCIENTIFIQUE (CNRS), Paris (FR)

(72) Inventors: Wojciech Knap, Saint Gely du Fesc (FR); Frédéric Teppe, Castries (FR); Nina Diakonova, Montpellier (FR); Michel Diakonov, Montpellier (FR); Oleg Klimenko, Moscow (RU); Sergey Ganichev, Sinzing (DE); Christop Drexler, Regensburg (DE)

(73) Assignee: Centre National De La Recherche Scientifique (CNRS), Paris (FR)

( * ) Notice: Subject to any disclaimer, the term of this patent is extended or adjusted under 35 U.S.C. 154(b) by 275 days.

(21) Appl. No.: 14/365,395

(22) PCT Filed: Dec. 4, 2012

(86) PCT No.: PCT/EP2012/074375
§ 371 (c)(1),
(2) Date: Jun. 13, 2014

(87) PCT Pub. No.: WO2013/087456
PCT Pub. Date: Jun. 20, 2013

(65) Prior Publication Data
US 2014/0375512 A1    Dec. 25, 2014

(30) Foreign Application Priority Data
Dec. 14, 2011    (FR) ...................... 11 61615

(51) Int. Cl.
*G01J 3/42* (2006.01)
*G01R 29/08* (2006.01)
*G01J 4/00* (2006.01)

(52) U.S. Cl.
CPC ............ *G01R 29/0878* (2013.01); *G01J 3/42* (2013.01); *G01J 4/00* (2013.01)

(58) Field of Classification Search
CPC .. G01R 29/10; G01R 29/0878; G01R 29/105; G01R 29/0871; G01R 29/0828

(Continued)

(56) References Cited

U.S. PATENT DOCUMENTS

| 5,418,544 A * | 5/1995 | Elliot ..................... H01Q 21/26 343/797 |
| 6,342,867 B1 * | 1/2002 | Bell ..................... H01Q 19/108 343/795 |

(Continued)

FOREIGN PATENT DOCUMENTS

| JP | 2010219442 A | 9/2010 |
| WO | 2006072762 A1 | 7/2006 |

OTHER PUBLICATIONS

Dyakonov et al. "Detecting, Mixing and Frequency Multiplication of Terahertz Radiation by Two-Dimensional Electronic Fluid, IEEE Transactions on Electron Devices, vol. 43, No. 3, Mar. 1996".*

(Continued)

*Primary Examiner* — Dieu H Duong
*Assistant Examiner* — Bamidele A Jegede
(74) *Attorney, Agent, or Firm* — Banner & Witcoff, Ltd.

(57) ABSTRACT

The invention relates to a device (1) for measuring the state of polarization of an incident wave of frequency 10 GHz to 30 THz, comprising a field effect transistor (2), a reception antenna (3). According to the invention, the antenna parts (31, 33) detect a component of polarization of the wave, (Continued)

Figure 1:
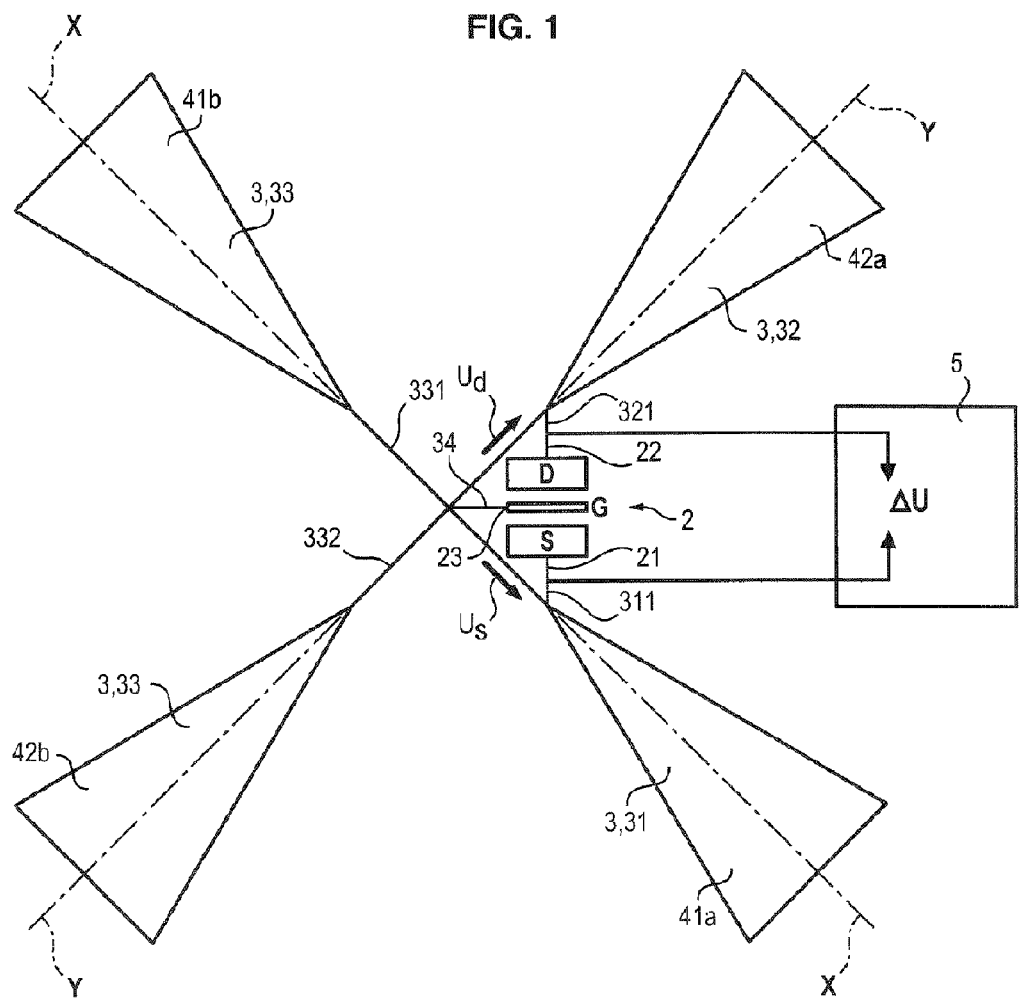

collinear with a direction (X) causing in the transistor (2) an alternating detection voltage (Us), the parts (32, 33) detect a component of polarization of the wave, collinear with a direction (Y) causing the appearance in the transistor (2) of an alternating detection voltage (Ud), the transistor (2) being designed to generate, as electrical detection signal ($\Delta U$) between the source terminal (21) and the drain terminal (22), a DC detection voltage ($\Delta U$) a part of which is determined by the state of elliptical polarization of the wave by interference in the transistor (2) between the alternating voltages (Us, Ud).

13 Claims, 2 Drawing Sheets

(58) Field of Classification Search
USPC .......................................................... 343/703
See application file for complete search history.

(56) References Cited

U.S. PATENT DOCUMENTS

| | | | | |
|---|---|---|---|---|
| 7,050,013 | B2* | 5/2006 | Kim | H01Q 13/106 343/725 |
| 7,362,281 | B2* | 4/2008 | Huang | H01Q 9/285 343/700 MS |
| 2011/0057845 | A1* | 3/2011 | Rotter | H01Q 13/106 343/700 MS |
| 2011/0298682 | A1* | 12/2011 | Plet | H01Q 1/246 343/797 |

OTHER PUBLICATIONS

Drexler et al. "Helicity Sensitive Terahertz Radiation Detection by FETs, Journal of Applied Physics, 111, 124504, 2012".*
Veksler et al. "Plasma wave FET for sub-wavelength THz Imaging, ISDRS Dec. 12-14, 2007, College Park MD, USA".*
Knap et al. "Field effect transistors for terahertz detection—silicon versus III—V material issue, Opto-Electronics Review 18(3), 2010, 225-230".*
Lifshits et al. "Photovoltaic effect in a gated two-dimensional electron gas in magnetic field, Jan. 18, 2009".*
Kim Sangwoo et al., "Room temperature terahertz detection based on bulk plasmons in antenna-coupled GaAs field effect transistors" Applied Physics Letters, Jun. 27, 2008, pp. 253508-253508, vol. 92, No. 25, American Institute of Physics, Melville, NY, US, XP012107736, ISSN: 0003-6951.
Wojciech Knap et al., "Field Effect Transistors for Terahertz Detection and Emission" Journal of Infrared, Milimeter, and Terahertz Waves, May 4, 2010, pp. 618-628, vol. 32, No. 5, Springer, Boston, US, XP019906672, ISSN: 1866-6906.
S. D. Ganichev, J. Kiermaier, W. Weber, S. N. Danilov, D. Schuh, Ch. Gerl, W. Wegscheider, D. Bougeard, G. Abstreiter, and W. Prettl, "Subnanosecond ellipticity detector for laser radiation", Appl. Phys. Lett. 91, No. 1, 091101 pp. 1-3, A1 (2007).
S. D. Ganichev, W. Weber, J. Kiermaier, S. N. Danilov, P. Olbrich, D. Schuh, W. Wegscheider, D. Bougeard, G. Abstreiter, and W. Prettl, All-electric detection of the polarization state of terahertz laser radiation, J. Appl. Phys. vol. 103, 114504 pp. 1-8 (2008).
S. N. Danilov, B. Wittmann, P. Olbrich, W. Eder, W. Prettl, L. E. Golub, E. V. Beregulin, Z. D. Kvon, N. N. Mikhailov, S. Dvoretsky, V. A. Shalygin, N. Q. Vinh, A. F. G. van der Meer, B. Murdin, and S. D. Ganichev, "Fast detector of the ellipticity of infrared and terahertz radiation based on HgTe quantum well structures", J. Appl. Phys. vol. 105, 013106 pp. 1-6 (2009).
S. D. Ganichev, V. V. Bel'kov, Petra Schneider, E. L. Ivchenko, S. A. Tarasenko, W. Wegscheider, D. Weiss, D. Schuh, E. V. Beregulin, and W. Prettl, "Resonant inversion of the circular photogalvanic effect in n-doped quantum wells" Phys. Rev. B., 035319 pp. 1-16 (2003).
S. D. Ganichev, Petra Schneider, V. V. Bel'kov, E. L. Ivchenko, S. A. Tarasenko, W. Wegscheider, D. Weiss, D. Schuh, B. N. Murdin, P. J. Phillips, C. R. Pidgeon, D. G. Clarke, M. Merrick, P. Murzyn, E. V. Beregulin, and W. Prettl, "Spin-galvanic effect due to optical spin orientation in n-type GaAS quantum well structures", Phys. Rev. B. (Rapid Communic.), vol. 68, 081302 pp. 1-4 (2003).
H. Diehl, V. A. Shalygin, V. V. Bel'kov, C. Hoffmann, S. N. Danilov, T. Herrle, S. A. Tarasenko, D. Schuh, C. Gerl, W. Wegscheider, W. Prettl and S. D. Ganichev, "Spin photocurrents in (110)-grown quantum well structures", New Journal Phys. vol. 9, 349 pp. 1-13 (2007).
J. Karch, P. Olbrich, M. Schmalzbauer, C. Zoth, C. Strandsteiner, M. Fehrenbacher, U. Wurstbauer, M. Glazov, S. A. Tarasenko, E. L. Ivchenko, D. Weiss, J. Eroms, and S. D. Ganichev, "Dynamic Hall Effect Driven by Circularly Polarized Light in a Graphene Layer", Phys. Rev. Lett. 97, 182107 pp. 1-4 (2010).
M. Diakonov and M. S. Shur, "Detection, Mixing, and Frequency Multiplication of Terahertz Radiation by Two-Dimensional Electronic Fluid", IEEE Trans Electron.Devices vol. 43, No. 3, pp. 380-387 (1996).
W. Knap, Y. Deng, S. Rumyantsev and M. S. Shur, "Resonant detection of subterahertz and terahertz by plasma waves in submicron field-effect transistors", Appl. Phys. Lett., vol. 81, No. 24, pp. 4637-4639 (2002).
X. G. Peralta, S. J. Allen, M. C. Wanke, N. E. Harff, J. A. Simmons, M. P. Lilly, J. L. Reno, P. J. Burke, and J. P. Eisenstein, "Terahertz photoconductivity and plasmon modes in double-quantum-well field-effect transistors", Appl. Phys. Lett., vol. 81, No. 9, pp. 1627-1629 (2002).
G. C. Dyer, J. D. Crossno, G. R. Aizin, E. A. Shaner, M.C. Wanke, J. L. Reno, and S. J. Allen, "A plasmonic terahertz detector with a monolithic hot electron bolometer" J. Phys.: Condens. Matter, vol. 21, 195803, pp. 1-6 (2009).
E. A. Shaner, Mark Lee, M. C. Wanke, A. D. Grine, and J. L. Reno, S. J. Allen, "Single-quantum-well grating-gated terahertz plasmon detectors", Appl. Phys. Lett., vol. 87, 193507, pp. 1-3 (2005).
D. B. Veksler, A. V. Muravjov, V. Yu. Kachorovskii, T. A. Elkhatib, K. N. Salama, X.-C. Zhang, and M. S. Shur, "Imaging of field-effect transistors by forcused terahertz radiation", Solid-State Electron. vol. 53, pp. 571-573 (2009).
W. Knap, F. Teppe, Y. Meziani, N. Dyakonova, J. Lusakowski, F. Boeuf, T. Skotnicki, D. Maude, S. Rumyantsev, and M. S. Shur, "Plasma wave detection of sub-terahertz and terahertz radiation by silicon field-effect transistors" Appl. Phys. Lett., vol. 85, No. 4, pp. 1-3 (2004).
W. Knap, V. Kachorovskii, Y. Deng, S. Rumyantsev, J.-Q. Lu, R. Gaska, M. S. Shur, G. Simin, X. Hu, M. Asif Khan, C. A. Saylor, and L. C. Brunel, "Nonresonant detection of terahertz radiation in field effect transistors", J. Appl. Phys., vol. 91, No. 11, pp. 9346-9353 (2002).
R. Tauk, F. Teppe, S. Boubanga, D. Coquillat, W. Knap, Y. M. Meziani, C. Gallon, F. Boeuf, T. Skotnicki, C. Fenouillet-Beranger, D. K. Maude, S. Rumyantsev, and M. S. Shur, "Plasma wave detection of terahertz radiation by silicon field effects transistors: Responsivity and noise equivalent power", Appl. Phys. Lett. 89, 253511, pp. 1-3 (2006).
M. Sakowicz, J. Lusakowski, K. Karpierz, M. Grynberg, W. Knap, and W. Gwarek, "Polarization sensitive detection of 100 GHz radiation by high-mobility field-effect transistors", J. Appl. Phys. vol. 104, 024519 pp. 1-5 (2008).
S. Kim, Jeramy D. Zimmerman, P. Focardi, A. C. Gossard, D. H. Wu, and M. S. Sherwin, "Room temperature terahertz detection based on bulk plasmons in antenna-coupled GaAs field effect transistors", Appl. Phys. Lett. 92, 253508 pp. 1-3 (2008).
W. Knap, D. Coquillat, N. Dyakonova, F. Teppe, O. Klimenko, H. Videlier, S. Nadar, J. Lusakowski, G. Valusis, F. Schuster, B. Giffard, T. Skotnicki, C. Gaquiere, and A. El Fatimy, "Plasma excitations in filed effect transistors for terahertz detection and emission", C. R. Physique, vol. 11, pp. 433-443 (2010).

(56) References Cited

OTHER PUBLICATIONS

D. Veksler, F. Teppe, A. P. Dmitriev, V. Yu. Kachorovskii, W. Knap, and M. S. Shur, "Detection of terahertz radiation in gated two-dimensional structures governed by dc current", Phys. Rev. B vol. 73, 125328 pp. 1-10 (2006).
International Search Report and Written Opinion mailed Jan. 4, 2013 (PCT/EP2012/074375); ISA/EP.
Kim Sangwoo et al "Room temperature terahertz detection based on bulk plasmons in antenna-coupled GaAs field effect transistors" Applied Physics Letters, Jun. 27, 2008, pp. 253508-253508, vol. 92, No. 25, American Institute of Physics, Melville, NY, US, XP012107736, ISSN: 0003-6951.
Wojciech Knap et al "Field Effect Transistors for Terahertz Detection and Emission" Journal of Infrared, Millimeter, and Terahertz Waves, May 4, 2010, pp. 618-628, vol. 32, No. 5, Springer, Boston, US, XP019906672, ISSN: 1866-6906.

* cited by examiner

DEVICE FOR MEASURING THE STATE OF POLARIZATION OF AN INCIDENT WAVE OF FREQUENCY 10 GHZ TO 30 THZ

The present application is a U.S. National Phase filing of International Application No. PCT/EP2012/074375, filed on Dec. 4, 2012, designating the United States of America and claiming priority to French Patent Application No. 1161615, filed Dec. 14, 2011, and this application claims priority to and the benefit of the above-identified applications, which are both incorporated by reference herein in their entireties.

The invention relates to a device for measuring the polarisation state of an incident wave of frequency greater than 10 GHz.

Such waves are also called sub-Terahertz or Terahertz (sub-THz or THz) waves or even millimetric and submillimetric waves. The range of frequencies of the relevant waves is traditionally divided into three parts spaced respectively from 10 to 100 GHz, from 100 GHz to 1 THz and from 1 THz to 6 THz for the latter. In the rest of this document the three frequency ranges mentioned above will be designated in general under the single term THz.

Measuring the polarisation state of light and particularly its transmitted, reflected, or dispersed ellipticity represents a powerful anisotropy analysis technique of some materials or different states of matter such as plasmas, gases, solids or surfaces, as well as biological tissue. Some representative examples are tokamak polarimetry for measuring electric and magnetic fields in ionised gases as well as the density of plasma, monitoring and control of the growth of materials, spectroscopy via circular dichroism and optical rotatory dispersion of proteins and molecules. The same applies for contactless and nondestructive measurements of surfaces and ultrathin films, or even analysis of gases and constituents of aerosol in the terrestrial atmosphere by optical teledetection sensitive to polarisation.

One of the recognised methods for producing information on the polarisation state of light is based on measuring a difference in optical paths. In the case of where it is necessary to measure the dynamic ellipticity of polarised light, ellipticity resolved in time can be measured by transmission of elliptical light through an analyser prism in rapid rotation, placed facing a photo-detector. It is also possible to use a pump-probe technique.

Several types of detectors sensitive to polarisation are used in THz polarimetry such as multi-contact photoconductors. But several types of effects causing ellipticity have also been proposed in publications [1], [2] and [3], such as: circular photogalvanic effect in publication [4], galvanic effect dependent on spin in publication [5], circular photon drag effect in publication [6] and alternative circular Hall effect in publication [7]. However, polarisation of transmitted or reflected light is generally low, and polarised THz spectroscopy lacks more effective detectors.

Recently, a novel class of THz radiation detectors has emerged. According to the proposition made in publication [8], detection of THz radiation by field-effect transistors (FET) has been demonstrated.

It has been shown that FETs can function as resonant voltage detectors in publications [9], [10], [11] and [12], or as broadband or so-called non-resonant detectors in publications [13], [14], [15] and [16].

Document [17] relates to a detector sensitive to the linear polarisation of a wave of 100 GHz by FETs, in which the detection signal is controlled as a function of the voltage between the gate and the source and as a function of an angle between an axis of symmetry of the transistor and the direction of linear polarisation of the wave.

Document [18] describes a detector sensitive to THz waves, comprising an antenna-coupling FET. This device functions by capacitively coupling Terahertz waves in the transistor and by using modifications in the current between the source and the drain.

However, this document indicates that at ambient temperature this detector responds only to waves having orthogonal polarisation relative to what was expected by the design of the antenna, so that the detector is sensitive only to vertical polarisations.

The aim of the invention is to provide a measuring device which is sensitive to the ellipticity of the incident wave.

The invention aims to provide a device for measuring the circular polarisation state of an incident wave of frequency going from 10 GHz to 30 THz, which performs a measurement with temporal resolution of a few picoseconds at ambient temperature of this polarisation state, and which is simple to execute and low-cost. In particular, the device must detect the ellipticity of the polarisation state of the wave.

For this purpose, a first subject matter of the invention is a device for measuring the polarisation state of an incident wave of frequency greater than 10 GHz and less than 30 THz, the device comprising:
 at least one field-effect transistor comprising at least one source terminal, at least one drain terminal and at least one gate terminal,
 an antenna for receiving the incident wave of frequency greater than 10 GHz and less than 30 THz, connected at least to the gate terminal,
 the source terminal and the drain terminal being connected to a circuit for measuring an electric detection signal present between the source terminal and the drain terminal,
 characterized in that
 the antenna for receiving the incident wave of frequency greater than 10 GHz and less than 30 THz is bidirectional, is provided outside the field-effect transistor, is separate from the terminals of the transistor and comprises a first antenna part connected to the source terminal, a second antenna part connected to the drain terminal and a third bidirectional antenna part connected to the gate terminal,
 the first antenna part and the third bidirectional antenna part being arranged to detect a first polarisation component of the wave, colinear to a first determined direction and causing the appearance in the transistor between the source terminal and the gate terminal of a first alternative detection voltage for detection of the first component in the first direction,
 the second antenna part and the third bidirectional antenna part being arranged to detect a second polarisation component of the wave, colinear to a second determined direction and causing the appearance in the transistor between the drain terminal and the gate terminal of a second alternative detection voltage for detection of the second component in the second direction,
 the first direction being nonparallel to the second direction and not being identical to the second direction,
 the transistor being arranged to generate, as electric detection signal between the source terminal and the drain terminal, a continuous detection voltage, a part of which is determined by the elliptical polarisation state of the wave by interference in the transistor between the first alternative detection voltage and the second alternative detection voltage, the circuit being provided to analyse the elliptical polarisation state of the wave by measuring the electric detection signal between the source terminal and the drain terminal.

According to an embodiment of the invention, the transistor is arranged to have a gate length, taken in the direction going from the source to drain, less than or equal to twice the characteristic damping distance of the first alternative voltage and of the second alternative voltage in the channel of the transistor.

According to an embodiment of the invention, the transistor is arranged to have a gate length, taken in the direction going from the source to the drain, less than or equal to twice a characteristic damping distance equal to $$L = \sqrt{\frac{\mu |U|}{\omega}},$$

where $\omega$ is the pulsing of the wave, $\mu$ is the mobility of the electrons in the channel of the transistor, U is the voltage difference at the threshold, $U=U_t-U_{gs}$ for $U_{gs}>U_t$ and $U=\eta kT/e$ for $U_{gs} \leq U_t$, where $U_t$ is the threshold voltage of the transistor and $U_{gs}$ is the continuous polarisation voltage applied between the gate terminal and the source terminal, $\eta$ is the ideality coefficient, T is the temperature, k is the Boltzmann constant.

According to an embodiment of the invention, the first antenna part comprises a first antenna arm and the third bidirectional antenna part comprises a third antenna arm, the first antenna arm and the third antenna arm being directed in the first determined direction by being opposite each other for detection of the first polarisation component of the wave, colinear to the first direction, the second antenna part comprising a second antenna arm and the third bidirectional antenna part comprising a fourth antenna arm, the second antenna arm and the fourth antenna arm being directed in the second determined direction by being opposite each other for detection of the second polarisation component of the wave, colinear to the second direction.

According to an embodiment of the invention, the first direction and the second direction are perpendicular.

According to an embodiment of the invention, the first arm is symmetrical relative to the first direction.

According to an embodiment of the invention, the second arm is symmetrical relative to the first direction.

According to an embodiment of the invention, the third arm is symmetrical relative to the second direction.

According to an embodiment of the invention, the fourth arm is symmetrical relative to the second direction.

According to an embodiment of the invention, the first arm and/or the second arm and/or the third arm and/or the fourth arm are triangular in form.

According to an embodiment of the invention, the first arm and/or the second arm and/or the third arm and/or the fourth arm are each planar.

According to an embodiment of the invention, the device also comprises at least one blade, the blade being a quarter wave blade relative to the frequency of the incident wave, the blade being set in rotation by a rotary device (ROT) about an axis (AX) of azimuth rotation, the blade being traversed by this incident wave to transmit it to the antenna (3).

According to an embodiment of the invention, a device is provided for determining the angle (ANG) of rotation of the blade (LAM) about the axis (AX) of rotation as a function of time, the circuit being connected to a data-processing device (COMP) for differential measuring of the elliptical polarisation state as a function of the angle (ANG) of rotation and as a function of the electric detection signal ($\Delta U$).

Figure 2A:
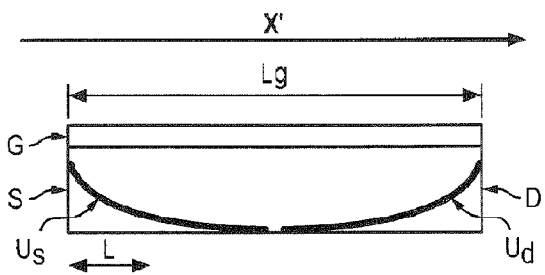
Figure 2B:
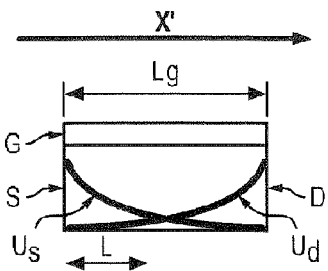
Figure 3:
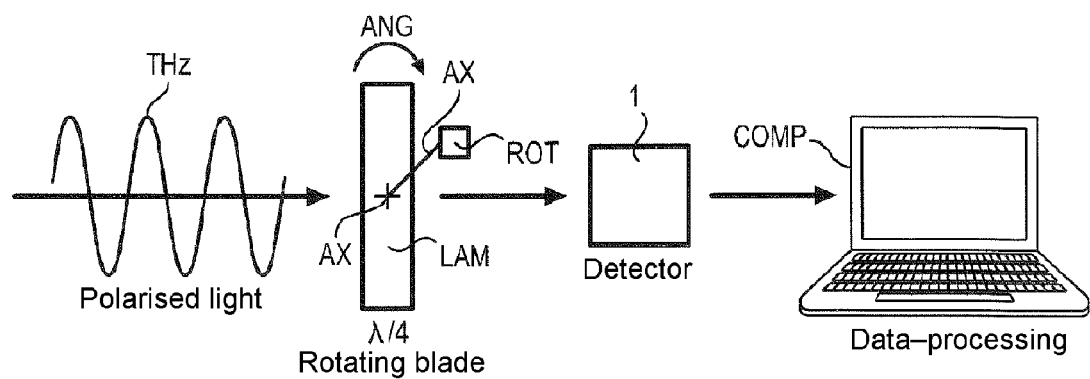
Figure 4:
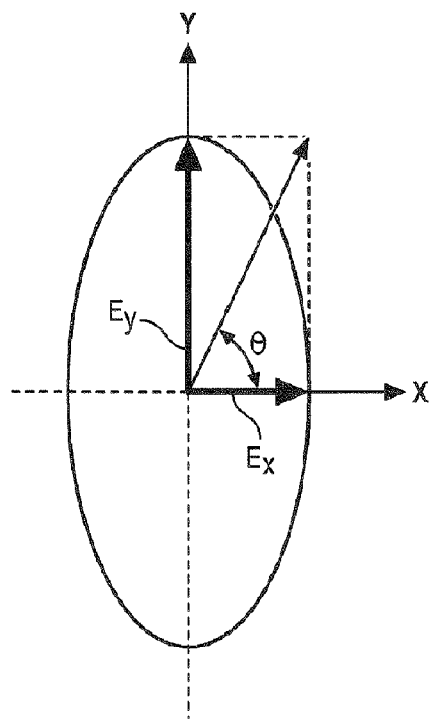
Figure 5:
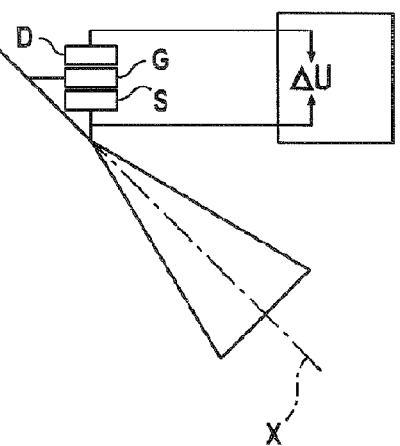

The invention will be more clearly understood from the following description, given solely by way of a nonlimiting example in reference to the attached drawings, in which:

FIG. 1 is a schematic view of an embodiment of the measuring device according to the invention, FIG. 2 is an example of use of a device in a measuring diagram, FIG. 2A is a schematic view of the profile of alternative voltage in the channel under the gate of the transistor of the measuring device according to the invention, in the case of a long gate, FIG. 2B is a schematic view of the voltage profile of the channel under the gate of the transistor of the measuring device according to the invention, in the case of a short gate, FIG. 3 is a diagram of an example of a measuring device according to the invention, provided to extract part of the continuous voltage due to the ellipticity of the wave, FIG. 4 illustrates an example of elliptical polarisation which can be detected by the device according to the invention, FIG. 5 illustrates a device which does not measure the polarisation state but only detects a linearly polarised wave.

FIG. 1 illustrates a measuring device for measuring the polarisation state of a wave or radiation (or radiation, these terms being employed randomly hereinbelow) THz or sub-millimetric, of frequency between 10 GHz and 30 THz, this wave being called THz hereinbelow.

The measuring device 1 comprises at least one field-effect transistor 2 (called FET) comprising a source terminal 21, a drain terminal 22 and a gate terminal 23. These terminals 21, 22 and 23 allow the electrical connection of the FET 2 to one or more external electric circuits.

A bidirectional antenna 3 for receiving the incident THz wave of frequency greater than 10 GHz and less than 30 THz is provided in the device 1. The antenna is intended to separate the two polarisation components of the incident wave and couple a component with the transistor channel on the source side and another component with the channel on the drain side. This antenna 3 is connected to the source terminal 21, to the drain terminal 22, and to the gate terminal 23. The antenna 3 comprises a first antenna part 31 connected to the source terminal 21, a second antenna part 32 connected to the drain terminal 22 and a third bidirectional antenna part 33 connected to the gate terminal 23. The antenna 3 is provided outside the transistor FET 2. The antenna 3 is separate from the terminals 21, 22, 23 of the transistor 2.

The first antenna part 31 and the third bidirectional antenna part 33 are arranged to detect a first polarisation component of the wave, colinear to a first determined direction X. This first polarisation component of the incident wave causes the appearance in the transistor 2 between the source terminal 21 and the gate terminal 23 of a first alternative detection voltage Us for detection of the first component in the first direction X.

The second antenna part 32 and the third bidirectional antenna part 33 are arranged to detect a second polarisation component of the wave, colinear to a second determined direction Y. This second polarisation component of the wave causes the appearance in the transistor 2 between the drain terminal 22 and the gate terminal 23 of a second alternative detection voltage Ud for detection of the second component in the second direction Y.

The first direction X is not parallel to the second direction Y and is not identical to this second direction Y, and is for example secant with the second direction Y.

The source terminal 21 and the drain terminal 22 are connected to a circuit 5 for measuring an electric detection signal ΔU present between the source terminal 21 and the drain terminal 22.

The transistor 2 is arranged to generate, as electric detection signal ΔU between the source terminal 21 and the drain terminal 22, a continuous detection voltage ΔU for detection of the elliptical polarisation state of the wave by interference in the transistor 2 between the first alternative detection voltage Us and the second alternative detection voltage Ud. The circuit 5 is a registration circuit for registrating the electric voltage ΔU measured between the source terminal 21 and the drain terminal 22.

The circuit 5 is provided to measure the electric detection signal ΔU between the source terminal 21 and the drain terminal 22. The continuous voltage ΔU contains the information on the elliptical polarisation state of the wave. Because of this, the electric detection signal ΔU between the source terminal 21 and the drain terminal 22 is a continuous detection voltage (ΔU), a part of which is determined by the elliptical polarisation state of the wave by interference in the transistor 2 between the first alternative detection voltage Us and the second alternative detection voltage Ud.

The elliptical polarisation is described as the superposition of two linear components having different polarisation axes.

Thanks to the invention, a field-effect transistor 2 can be used as a measurer of degree of circular or elliptical polarisation of THz radiation.

The sensitivity of FETs is particularly high (5 kV/W) and their noise equivalent power (NEP) is of the order of $10^{-10}$ $W/Hz^{0.5}$.

An embodiment of the antenna 3 is described hereinbelow.

The first antenna part 31 comprises a first antenna arm 41a.

The third bidirectional antenna part 33 comprises a third antenna arm 41b.

The first antenna arm 41a and the third antenna arm 41b are directed in a first determined direction X, and the first antenna arm 41a is opposite the third antenna arm 41b, for the reception of the first polarisation component of the incident wave, colinear to the first direction X.

The second antenna part 32 comprises a second antenna arm 42a.

The third bidirectional antenna part 33 comprises a fourth antenna arm 42b.

The second antenna arm 42a and the fourth antenna arm 42b are directed in the second determined direction Y, and the second antenna arm 42a is opposite the fourth antenna arm 42b, for the reception of the second polarisation component of the incident wave, colinear to the second direction Y.

The first antenna part 31 and the third bidirectional antenna part 33 are arranged to define a preferred first radiation polarisation axis, which corresponds to the direction passing through the arms 41a and 41b of the antenna. The antenna arms 41a, 41b are for example directed in the same first determined direction X. The preferred first radiation polarisation axis is for example the first direction X.

The second antenna part 32 and the third bidirectional antenna part 33 are arranged to define a preferred second radiation polarisation axis which corresponds to the direction passing through the arms 42a and 42b of the antenna.

The two antenna arms 42a, 42b are for example directed in the same second determined direction Y. The preferred second radiation polarisation axis is for example the second direction Y.

The arms 41a, 41b, 42a, 42b are for example metallised.

The first direction X and the second direction Y are perpendicular, for example.

In an embodiment, the first arm 41a is symmetrical relative to the first direction X.

In an embodiment, the second arm 41b is symmetrical relative to the first direction X.

In an embodiment, the third arm 42a is symmetrical relative to the second direction Y.

In an embodiment, the fourth arm 42b is symmetrical relative to the second direction Y.

In an embodiment, the first arm 41a and/or the second arm 41b and/or the third arm 42a and/or the fourth arm 42b are triangular in form, for example isosceles by symmetry relative to the direction X for 41a and 41b and by symmetry relative to the direction Y for 42a and 42b.

In an embodiment, the first arm 41a and/or the second arm 41b and/or the third arm 42a and/or the fourth arm 42b are each plane in form.

In the embodiment shown in FIG. 1, both the arms 41a and 41b are symmetrical relative to the first direction X, the arms 42a, 42b are symmetrical relative to the second direction Y, the arms 41a, 41b, 42a, 42b are each triangular and plane in form, for example isosceles in a same plane.

The antenna arms 41a, 41b, 42a, 42b occupy for example an angular sector centred on the direction X or Y.

The antenna arms 41a, 41b each occupy for example an angular sector having a total opening of between 0° and 180°, and especially between 20° and 40°.

The size of the antennas is adapted to the wavelength of the incident wave, and is of the order of 300 μm to 3 mm for each part 31, 32, 33.

For instance, in FIG. 1, the triangular arms 41a, 41b have a mean perpendicular having a length of 500 μm in the direction X and the triangular arms 42a, 42b have a mean perpendicular having a length of 500 μm in the direction Y, the arms 41a, 41b each occupy an angular sector having a total antenna opening equal to 30°, the antenna arms 42a, 42b each occupy an angular sector having a total opening equal to 30°.

The bidirectionality of the third antenna part 33 is such that it enables the first and third antenna parts to receive the first polarisation component of the incident wave, and enables the second and third antenna parts to receive the other second polarisation component of the incident wave, which is different to the first. Because of this, the third part of the antenna can comprise one arm, or several arms connected together by strands, or again differently.

In the figures, G designates the gate of the FET 2, S designates the source of the FET 2 and D designates the drain of the FET 2, such field-effect transistor 2 comprising under the gate G a channel between the source S and the drain D, as is known.

In the illustrated embodiment, as a non-limiting embodiment, the third bidirectional antenna part 3 comprises a third strand 331 serving as connection of the arm 41b to the gate and a fourth strand 332 serving as connection of the arm 42b to the gate terminal 23. The third strand 331 is directed for example in the first direction X. The fourth strand 332 is directed for example in the second direction Y. The strands 331 and 332 are for example connected to each other and are also connected to the gate terminal 23 by a connecting branch 34.

In the non-limiting embodiment shown, the strand 331 is directed along the arm 41b. In the embodiment shown, the second strand is directed along the arm 42b.

A first connection strand 311 for connection of the first antenna arm 41a to the source terminal 21 is provided.

A second connection strand 321 for connection of the second antenna arm 42a to the drain terminal 22 is provided.

In the non-limiting embodiment shown, the third strand 331 is perpendicular to the fourth strand 332.

The antenna 3 can be divided into two parts: the source part and the drain part. The polarisation axes X and Y are, for example, perpendicular to each other, therefore enabling potential detection of radiation polarised elliptically or circularly. In this case, a component of the polarisation of the incident radiation excites the electron plasma on the source side, and the other component on the drain side. When the gate is short enough, the zones of excitation of the plasma on the drain side and on the source side overlap in the channel. The result of this is constant drain-source voltage ΔU, part of which is due to interference between the two excitations. The amplitude of this interference grows when the polarisation of the wave becomes circular. In the case of linear polarisation the amplitude of the voltage due to the interference is equal to zero.

When the gate is not short enough, the plasma excitations are smoothed without having interfered and the constant drain-source voltage ΔU contains no information on the ellipticity of the light.

In an embodiment, the transistor FET 2 can be for example of MOSFET type (Metal Oxide Semiconductor Field Effect Transistor) for which the length Lg of the gate is equal to the length of the channel (length from source to drain) or of HEMT type (High Electron Mobility Transistor) for which the length Lg of the gate is less than the length of the channel (length from source to drain).

According to an embodiment of the invention, the transistor 2 is arranged to have a length Lg of a gate G, taken in the direction going from the source S to the drain D, less than or equal to twice the characteristic damping distance L of the first alternative voltage Us and of the second alternative voltage Ud in the channel of the transistor 2, that is, $Lg \leq 2L.$ This embodiment is illustrated in FIG. 2B.

According to an embodiment of the invention, the transistor 2 is arranged to have a length Lg of a gate G, taken in the direction going from the source S to the drain D, less than or equal to twice a characteristic damping distance L equal to $$L = \sqrt{\frac{\mu|U|}{\omega}},$$

where ω is the pulsation of the wave, μ is the mobility of electrons in the channel of the transistor 2, U is the voltage difference at the threshold, $U=U_t-U_{gs}$ for $U_{gs}>U_t$ and $U=\eta kT/e$ for $U_{gs} \leq U_t$, where $U_t$ is the threshold voltage of the transistor 2 and $U_{gs}$ is the continuous polarisation voltage applied between the gate terminal and the source terminal, η is the ideality coefficient, T is the temperature, k is the Boltzmann constant. For an incident frequency of 1 THz, mobility μ of 300 cm2/V·s and voltage difference U at the threshold of 100 mV, the characteristic damping distance L is 21.8 nm. The gate length Lg must therefore be less than or equal to 43.6 nm.

For a frequency of 300 GHz and the same other excursion voltage U and mobility μ values, the characteristic damping distance L is 39.8 nm. The gate length Lg must therefore be less than or equal to 79.6 nm.

For a frequency of 300 GHz, electronic mobility μ of 2000 cm2/V·s and excursion voltage U of 100 mV, the damping distance L is 102.8 nm; the gate length must therefore be less than or equal to 205.6 nm.

For instance, for a transistor 2 MOSFET, the length of the channel is 100 nm, as it is for the length from the drain to the source.

The device according to FIG. 1 enables detection of circular or elliptical polarisation of radiation. The length of the channel of the transistor 2 is short enough such that before being attenuated, the perturbation of the electron gas of the drain side mixes with the perturbation of the source side. X and Y are the polarisation axes of the two parts of the antenna enabling the excitation at the source side and at the drain side, respectively.

In FIGS. 2A and 2B the length of the gate G and of the channel located under the gate G is shown along the longitudinal axis x' going between the drain D and the source S. In FIG. 2A the gate length ($L_g$) is considerable ($L_g > 2L$), L being the damping distance of the plasma waves. In FIG. 2B the gate length is small ($2L > L_g$).

FIG. 2A describes the case according to which the channel is longer than twice the damping distance. The two perturbations of the electron gas are not superposed in the middle of the channel, therefore there is no mixing of the two signals and the transistor therefore cannot detect elliptical polarisation. Only linear polarisation can be detected. For instance, when the polarisation axis coincides (to simplify the demonstration) with the direction X, an alternative voltage Us is created only between the source terminal and the gate terminal, and the alternative voltage Ud between the drain terminal and the gate terminal is equal to zero. The detection signal ΔU, called $\Delta U_{linearX}$, is determined by the continuous voltage between the source terminal and the gate terminal. If the polarisation axis coincides with the direction Y, an alternative voltage Ud is created only between the drain terminal and the gate terminal and an alternative voltage Us between the source terminal and the gate terminal is equal to zero. The detection signal ΔU, $\Delta U_{linearY}$, is of opposite sign to $\Delta U_{linearX}$, making the transistor with antennas a device also sensitive to the linear polarisation state.

FIG. 2B corresponds to the case according to which the channel is shorter than or of a dimension equal to twice the damping distance. In other words, the two perturbations on the drain and source side are not fully dampened on arriving in the middle of the channel and therefore blend for detection of elliptical polarisation. The detection signal ΔU, called $\Delta U_{circular}$, is influenced by the size of the superposition zone of the excitations. The sign (negative or positive) of a part of continuous voltage created in this zone is determined by the circular polarisation state of radiation (circular right or circular left).

One of the possibilities for use of the measuring device according to the invention is an experimental device according to FIG. 3. FIG. 3 schematically shows an experimental and optional embodiment of the device for measuring the polarisation state of the light and is not restrictive to uses of the measuring device according to the invention.

According to this optional embodiment, the following are also provided:
- at least one blade LAM, the blade being quarter wave relative to the frequency of the incident wave, the blade being set in rotation by a rotary device ROT about an azimuth axis AX of rotation, the blade being traversed by this incident wave to transmit it to the antenna 3, a device for determining the angle of rotation ANG of the blade LAM about the axis AX of rotation as a function of time, the circuit being connected to a data-processing device COMP for differential measuring of the elliptical polarisation state as a function of the angle of rotation ANG and as a function of the electric detection signal ΔU.

Of course, the measuring device according to the invention may not comprise these characteristics, each of which is optional.

Therefore, in other embodiments, the incident wave THz can directly reach the antenna 3.

The optional embodiment of the device shown in FIG. 3 is based on measuring of the continuous voltage at the terminals of the channel of the transistor as a function of the angle of rotation of the phase-delay blade LAM (λ/4 blade). This voltage measured between source and drain comprises information relative to the ellipticity of the incident wave, originating from the mixture between the 2 perturbations of the electron gas occurring on the source side and drain side (cf. FIG. 4). In this diagram, THz radiation of unknown polarisation passes through a quarter wave blade in azimuth rotation and illuminates the detector 1 of elliptical polarisation Terahertz described previously. The variations in intensity of the source-drain signal, caused by the changes in ellipticity of the wave THz, as a function of the azimuth angle are recorded and processed by computer COMP. The signal recorded as a function of the azimuth angle of rotation of the λ/4 blade (where λ is the wavelength of the incident wave THz), allows differential measuring of the ellipticity and reconstitution of the polarisation axes of the incident wave THz.

It can be provided that the device for determining the angle (ANG) of rotation of the blade about the axis of rotation as a function of time is for example the device ROT for driving in rotation. The data-processing device enables to determine for example the numerical values Ex and Ey of the first polarisation component $E_x$ in the first direction X and of the second polarisation component $E_y$ in the second direction Y.

The speed at which the detector can carry out measurement allows it to be used potentially in polarisation time-measuring devices. Ultra-rapid variations of the order of a few picoseconds can in fact be followed by the elliptical polarisation detector described previously. In this configuration, the factor limiting the measuring speed is therefore the speed of rotation of the quarter wave blade.

The mechanism for detection THz of linear or circular polarisation is explained hereinbelow in reference to FIGS. 2A and 2B. In a simplified way, the excitation of the electron gas at one end of the channel, decreasing exponentially on approach to the opposite end, leads to continuous voltage ΔU at the terminals of the channel. The characteristic distance to which the voltage diminishes is determined by the parameter L. If the channel is long ($L_g$>2 L), the excitation of the plasma at one end does not reach the other end, and the continuous voltage ΔU drops to zero under the gate. If the channel is short (2L>$L_g$), the plasma is excited through the whole region under the gate, by being dampened from one end to the other. In the case of detection of radiation polarised linearly, the excitation of waves of density of electrons can occur just at one end of the channel and the detection signal, $\Delta U_{linear}$ is determined by the difference in continuous voltage between the two ends of the gate (FIG. 2A). For a sufficiently long gate this difference (and consequently detection) is maximal. It diminishes with the length of the gate (FIG. 2B) in 1/x'. In the case of detection of radiation having circular or elliptical polarisation, the excitation of the electron gas occurs by the two sides of the channel, and the detection signal $\Delta U_{circular}$ is determined by the size of the superposition zone of excitations and by the values of continuous voltages appearing at the terminals of the channel (FIG. 2B).

To analyse the type of polarisation of the THz radiation, it is preferable to use short-gate transistors (2L>$L_g$). In fact, if the gate is long ($L_g$>>2L, FIGS. 2A, 2C), only detection of the linear polarisation is possible (2A). In the case of a short gate (FIG. 2B), the variation in signal can be due only to a variation in polarisation of the circular configuration to those elliptical and/or linear ones. In addition, the change in sign of the signal formed in the superposition zone of the excitations corresponds to a change in direction of rotation of the polarisation vector.

The non-linear properties of the transistor result in rectifying of the alternating current caused by the incident radiation in continuous voltage. The photo-response consists in a continuous voltage (or current) appearing between source and drain, proportional to the incident radiation power. The length of the channel of the transistor in question is much shorter than the wavelength of the incident wave. The channel is also fully covered by the metal gate.

In the case of detection of radiation polarised linearly, asymmetry between source and drain is necessary to induce drain-source photovoltage. In the case of detection of radiation polarised circularly or elliptically, to cause drain-source photovoltage representing the polarisation state of incident radiation, it is necessary to have asymmetry between the source and the drain for each polarisation component detected. Because of this, the whole antenna can be symmetrical between source and drain. As for the present invention, this asymmetry comes from the asymmetrical design of gate-drain antennas 42b, 32 and source-gate antennas 31, 41b (see FIG. 1).

The operating regime of the FET as detector THz depends on the frequency ω of radiation and the gate length $L_g$. An important parameter is ωτ, where τ is the relaxation time of the moment of electrons. The value of this parameter determines whether the plasma waves are excited (ωτ>1), or not (ωτ<1) in the channel by the incident radiation. The most frequent case is in question, according to which ωτ<1, such that plasma oscillations are substantially dampened or are transformed into perturbations of charge density and the transistor FET functions as a broadband detector.

On the other hand, according to an embodiment, the gate length Lg must be less than or equal to twice the characteristic damping distance L. Alternating current induced at the source can then spread into the channel beneath the gate at a distance of the order of L. If the gate length $L_g$ is much greater than the damping distance L, photo-voltage is generated in a region very near the source contact and therefore does not depend on the length $L_g$. However, if $L_g$<L, the photo-voltage diminishes as L/$L_g$.

The condition at the limits at the source (x=0) reads:

$$(U+z_s I)_{x=0} = U_s \cos(\omega t), \quad (2)$$

where U and I are the alternating source-gate voltage and the current of the channel, respectively, $z_s$ is the impedance of the effective antenna 31, 41b for the source-gate contacts, $U_s$ is the alternative voltage provided by the antenna in open-circuit conditions.

The quantity $U_s$ is linked to the intensity of the incoming radiation, J, and the sensitivity of the antenna, β, by the relation:

$$U_s^2 = \beta \alpha_s J, \quad (3)$$

It should be noted that the sensitivity $\beta\alpha_s$ depends on the frequency.

A condition on similar limits must be imposed at the drain side ($x=L_g$) by replacement of the index s by d. The pertinent parameter is the ratio between the antenna impedance $z_s$ and the transistor impedance Z. The transistor impedance Z depends on the length of the channel, the polarisation voltage of the gate and the frequency of the radiation. In the case of limit $z_s \ll Z$, the condition at the limits reduces to $(U)_{x=0} = U_s \cos(\omega t)$, in the opposite limit direction $z_s \gg Z$ it can be written as $(z_s I)_{x=0} = U_s \cos(\omega t)$. The first limit case has been judged previously [8, 19, 20], with the hypothesis according to which radiation is applied only between the source and gate contacts, and for $U_0 = U_g - U_{th} > 0$ the photo-response is given by the following equation (4):

$$\delta U_{sd} = \frac{U_x^2}{4U_0}\left[1 - \frac{1}{2}\exp\left(-\frac{2L_g}{l}\right)\right]$$

The case where $U_0 \leq 0$ has been studied in reference [15]. It has been shown that the photo-response of the transistor has a maximum around the threshold. Dependence of the photo-response as a function of the gate polarisation in the region under the threshold, $f(U_g)$, depends on the continuous gate leak current and the impedance of the transistor. So, in using equation (3) the continuous photo-voltage DC can be rewritten as follows:

$$\alpha U_{sd} = \beta \cdot J \cdot f(U_g) \quad (5)$$

where the function $f(U_g)$ is described in [15]. For $U_0$ positive, $f = \frac{1}{4} U_0$.

Contrary to the standard approach, in the invention radiation is brought at both sides of the transistor. In other terms, radiation coupling with the channel of the transistor is modelled by two effective antennas, one of which produces the first alternative voltage $U_s$ between the source and the gate, and the other produces the second alternative voltage $U_d$ between the drain and the gate (see FIG. 1). The contributions of these inputs to the photo-response $\delta U_s$ and $\delta U_d$ are of opposite signs, such that if the respective amplitudes and phases are equal, the resulting photo-response is zero.

In the general case, the photovoltaic response is given by:

$$\delta U_{sd} = (\beta_s(\omega) \cdot f_s(U_g) - \beta_d(\omega) \cdot f_d(U_g)) \cdot J \quad (6)$$

where $\delta U_{sd} = |U_s|^2 \cdot f_s(U_g)$, $\delta U_d = |U_d|^2 \cdot f_d(U_g)$, $U_s = \beta_s(\omega) \cdot J$, $U_d = \beta_d(\omega) \cdot J$.

The first alternative voltage Us causes a first perturbation of the density of electric charges at the source side of the channel, spreading into the channel towards the drain.

The second alternative voltage Ud causes a second perturbation of the density of electric charges at the drain side of the channel, spreading into the channel towards the source.

The transistor is arranged to generate an interference, sensitive to the elliptical polarisation state of the wave, between the first and the second perturbation caused respectively by the alternative voltages Us and Ud between the source terminal 21 and the drain terminal 22. This interference is the origin of the part of the continuous electric signal, which is sensitive to the elliptical polarisation state of the wave, between the source and the drain.

In these equations, $\beta_s$ and $\beta_d$ are the sensitivities of the source-gate antenna part 31, 41b and of the drain-gate antenna part 32, 42b and the functions $f_s(U_g)$ and $f_d(U_g)$ describe photo-responses as a function of the polarisation voltage of the gate generated from the source and drain sides of the channel.

As experimental results hereinbelow show:
(i) the efficiency of the antenna depends largely on the frequency of the incident radiation,
(ii) the two effective antennas are sensitive to the radiation polarisation: one of them is especially sensitive to polarisation $E_x$ according to X, and the other to polarisation $E_y$ according to Y. For elliptical polarisation, the alternative signals to the source and the drain are dephased by a nonzero angle θ (angle θ between the first polarisation component $E_x$ in the first direction X and the second polarisation component $E_y$ in the second direction Y, as is shown by way of example in FIG. 4 for example, for radiation polarised circularly $\theta = \pm \pi/2$). The resulting photo-voltage, $\delta U_{sd}$, gives a term of additional interference proportional to $J^*(\beta_s \beta_d)^{1/2} * \sin \theta * \exp(-L_g/L)$. This term is sensitive to the ellipticity of the incident radiation (sign of θ) and can dominate if $\beta_s$ is almost equal to $\beta_d$.

In a general manner, $$\delta U_{sd} = U_s - U_d + \left(\sqrt{U_d \cdot U_s} \cdot \sin\theta \cdot e^{-\left(\frac{Lg}{L}\right)}\right)$$

The continuous detection voltage ΔU for detection of the elliptical polarisation state of the wave by interference is:

$$\Delta U = \left(\sqrt{U_d \cdot U_s} \cdot \sin\theta \cdot e^{-\left(\frac{Lg}{L}\right)}\right)$$

In a general manner, $U_s$ is less than 100 mV. In a general manner, $U_d$ is less than 100 mV.

In a numerical example, for example for $\theta \approx 76°$ for which $\tan\theta = 4$ and $\sin\theta = 0.97$, there is:

Incident power on the axis y:

$$P^y = \frac{U_a^2}{4Z_s} = 1 \text{ mW}$$

$U_a$ is the amplitude of the voltage induced on the antenna between the source and the gate, $Z_s$ is the impedance of the effective antenna for the source-gate contacts $$U_s = \frac{U_a^2}{4} \cdot \frac{1}{U^*}$$

with $U^* = \frac{2\eta k_B T}{e} = 25 \text{ mV}$

η is the ideality factor, $k_B$ is the Boltzmann constant, T is the temperature, e is the electron charge.

$$U_a^2 = 1 \text{ mW} \cdot Z \cdot \left(\frac{S_{ant.}}{S_{beam}}\right)$$

Z=10 kΩ is the impedance of the channel, $S_{ant.}$ is the surface of the antenna, $S_{beam}$ is the surface of the beam in the plane of the antenna $$\frac{S_{ant.}}{S_{beam}} = \frac{(50 \ \mu m)^2}{(500 \ \mu m)^2} = 10^{-2} \text{ in this case.}$$

$$U_a^2 = 10^{-1} V^2$$

$$U_a = 316 \text{ mV}$$

$$\text{Therefore } U_s = \frac{(316 \text{ mV})^2}{100 \text{ mV}} \approx 1 \text{ mV}$$

Therefore, incident power on the axis X:

$$P^x = \frac{(U_b)^2}{4 \cdot Z_s} = 0.25 \text{ mW}$$

Where $U_b$ is the amplitude of the voltage induced on the antenna between the gate and the drain, with $$\tan\theta = \frac{P^y}{P^x} = \frac{U_s}{U_d}$$

Giving: $U_d = 0.25$ mV $$\delta U_{sd} = U_s - U_d + \left(\sqrt{U_d \cdot U_s} \cdot \sin\theta \cdot e^{-\left(\frac{L_g}{L}\right)}\right) = 775 \ \mu V$$

The continuous detection voltage ΔU for detection of the elliptical polarisation state of the wave by interference in this example is:

$$U_d \cdot U_s \cdot \sin\theta \cdot e^{-\left(\frac{L_g}{L}\right)} = \sqrt{25.10^{-8}} \cdot \sin\theta \cdot 5.10^{-2} = 25 \ \mu V \cdot \sin\theta = \underline{25 \ \mu V}$$

To date, THz polarimetry was not developed simply by absence of circular and elliptical polarisation detectors. This lack can be overcome by the present invention.

Potentially, the THz polarimetry is a domain of extremely important studies, about identification of different materials and their properties, as well as those of the different sources of THz radiation. It is possible to draw a parallel between the potential applications of the THz polarimetry and those of the optic range. In fact, interaction of the polarised light with the material has allowed the rise in numerous applications. The latter are based mainly on determining the intrinsic structure of solids, but also on that of biological objects (by means of polarisation microscopy), on quantic transitions, but also on astrophysical measurements of remote objects. In general, polarisation of light as a tool helps study all sorts of anisotropies of matter such as: the behaviour of gases, liquids and solids in the fields of anisotropic perturbations (mechanical, acoustic, electric, photonic), but also the structure of optically anisotropic materials, as well as the elastic constraints in the materials, etc.

Information on polarisation of THz waves also gives an additional boost to the development of existing applications in the THz domain. Because of this, for product quality control, THz polarimetry can determine not only the defects affecting the transparency of the material in the form of fissures and cavities, but also the defects due to stress and internal voltages, affecting only the polarisation of transmitted light. As for nondestructive chemical analysis of organic substances, including biological, the polarisation measurements can provide extra information impossible to extract from simple spectroscopic studies. The use of circular polarisation is also significant in the field of telecommunications. In the case of linearly polarised radiation, the receiver must be deployed in the respect of polarisation of the incident wave. And in the case of circular polarisation, additional adjustment of the receiver is not necessary.

Therefore, development of THz polarimetry can complete existing methods of THz analysis based on the definition of power and frequency of radiation. As a consequence, it is possible to obtain all the information relative to the objects studied in the THz range.

A field of application can also be THz polarimetry, for analysis of images in the field of quality control. Another possible application can be the characterisation of laboratory instrumentation (THz laser, for example) or the characterisation of materials (biological products, for example).

A novel device is proposed for measuring the polarisation of given THz radiation at ambient temperature. This apparatus synthetically comprises a 2D antenna, a field-effect transistor which rectifies the Terahertz radiation, a reading circuit and a protective case. The novelty of the invention is based on the use of FETs for determining the polarisation of THz radiation, and on the antenna design which enable to use these FETs for detection of THz radiations polarised circularly. We propose an antenna comprising three parts connected to three transistor contacts (source, drain and gate) and forming a right angle, for example. Thanks to this geometry, the orthogonal polarisation components of the THz radiation are detected. These two components excite the FET transistor on each side of the channel (source and drain). When the transistor channel is short enough, the excitations are mixed and result in a signal presenting as continuous voltage between the source and the drain. The device determines the change in polarisation helicity of the beam (from circular right to circular left) by the change of sign of the measured signal.

In FIG. 5, the antenna has only two lobes, connected to the gate and the source of the transistor. The antenna is sensitive to radiation polarised linearly according to the axis X. This radiation excites the electron density waves in the channel of the transistor, between the gate and the source. Exciting this channel under the gate creates a continuous voltage drain-source, ΔU, constituting the detection signal. Any polarisation component perpendicular to the axis X would not contribute to excitation of the electron gas and, consequently, could not be detected by the transistor.

In FIG. 5, the THz antenna for the field-effect transistor allows detection of linearly polarised radiation only. X is the polarisation axis of the antenna, D is the drain, S the source, G the gate and ΔU is the detection signal.

The invention directly measures the circular or elliptical polarisation of THz radiation. The value of the voltage measured at the terminals of the device in fact enables direct determination of angles and polarisation axes of the radiation in question. The characteristics of this invention are: its rapidity, its low internal noise, its ease of use, its very low production cost, its possibility for integration into matrices (multi-pixel measurements) and its small dimensions. The device functions at ambient temperature and is also characterized by its low power consumption.

LIST OF REFERENCES CITED

[1] S. D. Ganichev, J. Kiermaier, W. Weber, S. N. Danilov, D. Schuh, Ch. Gerl, W. Wegscheider, D. Bougeard, G. Abstreiter, and W. Prettl, Appl. Phys. Lett. 91, 091101 (2007).

[2] S. D. Ganichev, W. Weber, J. Kiermaier, S. N. Danilov, P. Olbrich, D. Schuh, W. Wegscheider, D. Bougeard, G. Abstreiter, and W. Prettl, J. Appl. Phys. 103, 114504 (2008).

[3] S. N. Danilov, B. Wittmann, P. Olbrich, W. Eder, W. Prettl, L. E. Golub, E. V. Beregulin, Z. D. Kvon, N. N. Mikhailov, S. A. Dvoretsky, V. A. Shalygin, N. Q. Vinh, A. F. G. van der Meer, B. Murdin, and S. D. Ganichev, J. Appl. Phys. 105, 013106 (2009).

[4] S. D. Ganichev, V. V. Bel'kov, Petra Schneider, E. L. Ivchenko, S. A. Tarasenko, W. Wegscheider, D. Weiss, D. Schuh, E. V. Beregulin, and W. Prettl, Phys. Rev. B., 035319 (2003).

[5] S. D. Ganichev, Petra Schneider, V. V. Bel'kov, E. L. Ivchenko, S. A. Tarasenko, W. Wegscheider, D. Weiss, D. Schuh, B. N. Murdin, P. J. Phillips, C. R. Pidgeon, D. G. Clarke, M. Merrick, P. Murzyn, E. V. Beregulin, and W. Prettl, Phys. Rev. B. (Rapid Communic.), 081302 (2003).

[6] H. Diehl, V. A. Shalygin, V. V. Bel'kov, C. Hoffmann, S. N. Danilov, T. Herrle, S. A. Tarasenko, D. Schuh, C. Gerl, W. Wegscheider, W. Prettl and S. D. Ganichev, New Journal Phys. 9, 349 (2007).

[7] J. Karch, P. Olbrich, M. Schmalzbauer, C. Zoth, C. Strandsteiner, M. Fehrenbacher, U. Wurstbauer, M. Glazov, S. A. Tarasenko, E. L. Ivchenko, D. Weiss, J. Eroms, and S. D. Ganichev, Phys. Rev. Lett. 97, 182107 (2010).

[8] M. Diakonov and M. S. Shur, IEEE Trans Electron. Devices 43, 380 (1996).

[9] W. Knap, Y. Deng, S. Rumyantsev and M. S. Shur, Appl. Phys. Lett., 81, 4637 (2002).

[10] X. G. Peralta, S. J. Allen, M. C. Wanke, N. E. Harff, J. A. Simmons, M. P. Lilly, J. L. Reno, P. J. Burke, and J. P. Eisenstein, Appl. Phys. Lett. 81, 1627 (2002).

[11] G. C. Dyer, J. D. Crossno, G. R. Aizin, E. A. Shaner, M. C. Wanke, J. L. Reno, and S. J. Allen, J. Phys.: Condens. Mater 21, 195803 (2009).

[12] E. A. Shaner, Mark Lee, M. C. Wanke, A. D. Grine, and J. L. Reno, S. J. Allen, Appl. Phys. Lett. 87, 193507 (2005).

[13] D. B. Veksler, A. V. Muravjov, V. Yu. Kachorovskii, T. A. Elkhatib, K. N. Salama, X. C. Zhang, and M. S. Shur, SolidState Electron. 53, 571 (2009).

[14] W. Knap, F. Teppe, Y. Meziani, N. Dyakonova, J. Lusakowski, F. Boeuf, T. Skotnicki, D. Maude, S. Rumyantsev, and M. S. Shur, Appl. Phys. Lett. 85, 675 (2004).

[15] W. Knap, V. Kachorovskii, Y. Deng, S. Rumyantsev, J.-Q. Lu, R. Gaska, M. S. Shur, G. Simin, X. Hu, M. Asif Khan, C. A. Saylor, and L. C. Brunel, J. Appl. Phys., 91, 9346 (2002).

[16] R. Tauk, F. Teppe, S. Boubanga, D. Coquillat, W. Knap, Y. M. Meziani, C. Gallon, F. Boeuf, T. Skotnicki, C. Fenouillet-Beranger, D. K. Maude, S. Rumyantsev, and M. S. Shur, Appl. Phys. Lett. 89, 253511 (2006).

[17] M. Sakowicz, J. Lusakowski, K. Karpierz, M. Grynberg, W. Knap, and W. Gwarek, J. Appl. Phys. 104, 024519 (2008).

[18] S. Kim, Jeramy D. Zimmerman, P. Focardi, A. C. Gossard, D. H. Wu, and M. S. Sherwin, Appl. Phys. Lett. 92, 253508 (2008).

[19] W. Knap, D. Coquillat, N. Dyakonova, F. Teppe, O. Klimenko, H. Videlier, S. Nadar, J. Lusakowski, G. Valusis, F. Schuster, B. Giffard, T. Skotnicki, C. Gaquiere, and A. El Fatimy C. R. Physique, 11, 433 (2010).

[20] D. Veksler, F. Teppe, A. P. Dmitriev, V. Yu. Kachorovskii, W. Knap, and M. S. Shur, Phys. Rev. B 73, 125328 (2006).

The invention claimed is:

1. A device for measuring the polarisation state of an incident wave of frequency greater than 10 GHz and less than 30 THz, the device comprising:
at least one field-effect transistor comprising at least one source terminal, at least one drain terminal and at least one gate terminal,
an antenna for receiving the incident wave of frequency greater than 10 GHz and less than 30 THz, connected at least to the gate terminal,
the source terminal and the drain terminal being connected to a circuit for measuring an electric detection signal ($\Delta U$) present between the source terminal and the drain terminal,
wherein the antenna for receiving the incident wave of frequency greater than 10 GHz and less than 30 THz is provided outside the field-effect transistor, is separate from the terminals of the transistor and comprises a first antenna arm connected to the source terminal and extending in a first determined direction (X), a second antenna part connected to the drain terminal and extending in a second determined direction (Y), and a third antenna part comprising a third antenna arm and a fourth antenna arm, which extend respectively in the first determined direction (X) and in the second determined direction (Y) and which are both connected to the gate terminal, so that the first antenna arm and the third antenna arm
detect a first polarisation component of the wave, which is colinear to the first determined direction (X) and which causes the appearance in the transistor between the source terminal and the gate terminal of a first alternative detection voltage ($U_s$) for detection of the first component in the first determined direction (X) and so that the second antenna arm and the fourth antenna arm
detect a second polarisation component of the wave, which is colinear to the second determined direction (Y) and which causes the appearance in the transistor between the drain terminal and the gate terminal of a second alternative detection voltage ($U_d$) for detection of the second component in the second determined direction (Y),
the first determined direction (X) being not parallel to the second determined direction (Y) and not being identical to the second determined direction (Y),
the transistor being arranged to generate, as electric detection signal ($\Delta U$) between the source terminal and the drain terminal, a continuous detection voltage ($\Delta U$), a part of which is determined by the elliptical polarisation state of the wave by interference in the transistor between the first alternative detection voltage ($U_s$) and the second alternative detection voltage ($U_d$), the circuit being provided to analyse the elliptical polarisation state of the wave by measuring the electric detection signal ($\Delta U$) between the source terminal and the drain terminal.

2. The device according to claim 1, wherein the transistor is arranged to have a gate (G) length (Lg), taken in a direction going from the source (S) to the drain (D), less than or equal to twice the characteristic damping distance (L) of the first alternative voltage ($U_s$) and of the second alternative voltage ($U_d$) in the channel of the transistor.

3. The device according to claim 1, wherein the transistor is arranged to have a gate (G) length (Lg), taken in a direction going from the source (S) to the drain (D), less than or equal to twice a characteristic damping distance (L) equal to $$L = \sqrt{\frac{\mu |U|}{\omega}},$$

where ω is the pulsation of the wave, µ is the mobility of electrons in the channel of the transistor, U is the voltage difference at the threshold, $U=U_t-U_{gs}$ for $U_{gs}>U_t$ and $U=\eta kT/e$ for $U_{gs}\leq U_t$, where $U_t$ is the threshold voltage of the transistor and $U_{gs}$ is the continuous polarisation voltage applied between the gate terminal and the source terminal, η is the ideality coefficient, T is the temperature, k is the Boltzmann constant.

4. The device according to claim 1, wherein the first antenna arm and the third antenna arm are directed in the first determined direction (X) by being opposite each other for detection of the first polarisation component of the wave, colinear to the first determined direction (X), the second antenna arm and the fourth antenna arm are directed in the second determined direction (Y) by being opposite each other for detection of the second polarisation component of the wave, colinear to the second determined direction (Y).

5. The device according to claim 4, wherein the first antenna arm and/or the second antenna arm and/or the third antenna arm and/or the fourth antenna arm are each planar.

6. The device according to claim 1, wherein the first determined direction (X) and the second determined direction (Y) are perpendicular.

7. The device according to claim 4, wherein the first antenna arm is symmetrical relative to the first determined direction (X).

8. The device according to claim 4, wherein the second antenna arm is symmetrical relative to the first determined direction (X).

9. The device according to claim 4, wherein the third arm is symmetrical relative to the second determined direction (Y).

10. The device according to claim 4, wherein the fourth arm is symmetrical relative to the second determined direction (Y).

11. The device according to claim 4, wherein the first antenna arm and/or the second antenna arm and/or the third determined arm and/or the fourth determined arm are triangular in form.

12. The device according to claim 1, comprising also at least one blade (LAM), the blade being a quarter wave blade relative to the frequency of the incident wave, the blade being set in rotation by a rotary device (ROT) about an azimuth axis (AX) of rotation, the blade being traversed by this incident wave to transmit it to the antenna.

13. The device according to claim 12, wherein a device is provided for determining the angle (ANG) of rotation of the blade (LAM) about the axis (AX) of rotation as a function of the time, the circuit being connected to a data-processing device (COMP) for differential measuring of the elliptical polarisation state as a function of the angle (ANG) of rotation and as a function of the electric detection signal (ΔU).

* * * * *